United States Patent
Bidel et al.

(10) Patent No.: US 10,153,610 B2
(45) Date of Patent: Dec. 11, 2018

(54) LASER SOURCE, AND APPARATUS AND METHOD FOR SIMULTANEOUSLY INTERACTING WITH A PLURALITY OF ATOMIC SPECIES

(71) Applicant: ONERA (OFFICE NATIONAL D'ETUDES ET DE RECHERCHES AEROSPATIALES), Palaiseau (FR)

(72) Inventors: Yannick Bidel, Palaiseau (FR); Nassim Zahzam, Palaiseau (FR); Alexandre Bresson, Palaiseau (FR)

(73) Assignee: ONERA (OFFICE NATIONAL D'ETUDES ET DE RECHERCHES AEROSPATIALES), Palaiseau (FR)

( * ) Notice: Subject to any disclaimer, the term of this patent is extended or adjusted under 35 U.S.C. 154(b) by 134 days.

(21) Appl. No.: 15/329,301

(22) PCT Filed: Jul. 29, 2015

(86) PCT No.: PCT/FR2015/052104
§ 371 (c)(1),
(2) Date: Jan. 26, 2017

(87) PCT Pub. No.: WO2016/016579
PCT Pub. Date: Feb. 4, 2016

(65) Prior Publication Data
US 2017/0222394 A1    Aug. 3, 2017

(30) Foreign Application Priority Data

Jul. 30, 2014 (FR) ...................................... 14 57361

(51) Int. Cl.
*G01J 3/02* (2006.01)
*H01S 5/00* (2006.01)
(Continued)

(52) U.S. Cl.
CPC .............. *H01S 5/0092* (2013.01); *G02F 1/37* (2013.01); *H01S 3/0092* (2013.01);
(Continued)

(58) Field of Classification Search
CPC ........ G01J 3/00; G01J 3/02; G01J 3/10; G01J 3/18; H01S 5/00; H01S 5/40; G02F 1/37
See application file for complete search history.

(56) References Cited

U.S. PATENT DOCUMENTS

| 2005/0058163 A1* | 3/2005 | Kane ...................... H01S 3/0675 372/10 |
| 2012/0224243 A1 | 9/2012 | Friedenauer et al. |
| 2013/0293895 A1 | 11/2013 | Oto et al. |

FOREIGN PATENT DOCUMENTS

JP    H01 321340 A    12/1989

OTHER PUBLICATIONS

International Search Report dated Jan. 18, 2016 in corresponding PCT application.
(Continued)

*Primary Examiner* — Abdullahi Nur
(74) *Attorney, Agent, or Firm* — Young & Thompson

(57) ABSTRACT

A laser source (100) is intended for a device for interacting simultaneously with several atomic species within time intervals which are common to these species. The laser source includes a laser radiation generating set (1), an optical amplifier (2), and a frequency doubler set (3). A component for time-division multiplexing (5) assign in alternation at successive time sub-intervals, initial radiations corresponding to interaction radiations dedicated to different atomic species. The result of the interactions with one of the atomic species is then identical to the result of the interactions with a continuous radiation dedicated to the atomic species.

20 Claims, 5 Drawing Sheets

Figure 1B:
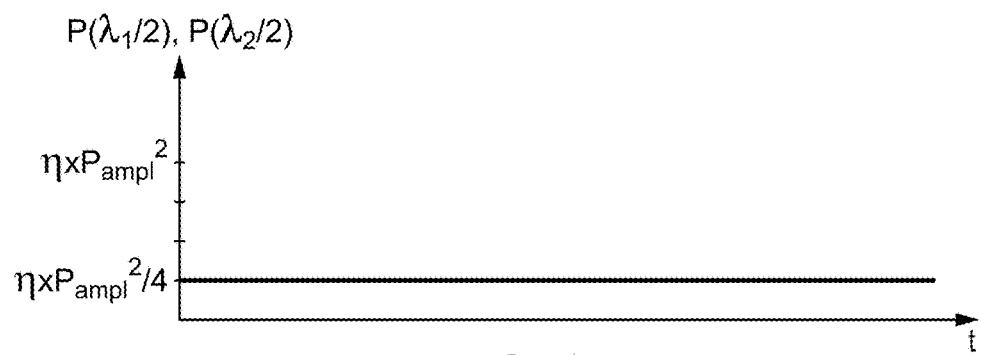

(51) Int. Cl.
    H01S 5/40      (2006.01)
    G02F 1/37      (2006.01)
    H01S 3/00      (2006.01)
(52) U.S. Cl.
    CPC .......... *H01S 5/0057* (2013.01); *H01S 5/0085*
            (2013.01); *H01S 5/4025* (2013.01); *H01S*
            *5/4087* (2013.01); *H01S 3/0085* (2013.01)

(56) References Cited

OTHER PUBLICATIONS

Jiutao Wu et al: "Erbium fiber laser based direct frequency comb spectroscopy of Rb two-photon transitions", Optics Letters, vol. 38, No. 23, Dec. 1, 2013 (Dec. 1, 2013), pp. 5028-5031, XP002737720, figure 1.

Menoret V. et al: "Dual-wavelength laser source for onboard atom interferometry", Optics Letters, Optical Society of America, vol. 36, No. 21, Nov. 1, 2011 (Nov. 1, 2011), pp. 4128-4130, XP001570722, ISSN: 0146-9592, 001: 10.1364/0L.36.004128 [retrieved on Oct. 19, 2011].

Zhongzhong Qin et al: II Compact diode-laser-pumped quantum light source based on four-wave mixing in hot rubidium vapor II, Optics Letters, Optical Society of America, vol. 37, No. 15, Aug. 1, 2012 (Aug. 1, 2012), pp. 3141-3143, XP001577497.

\* cited by examiner

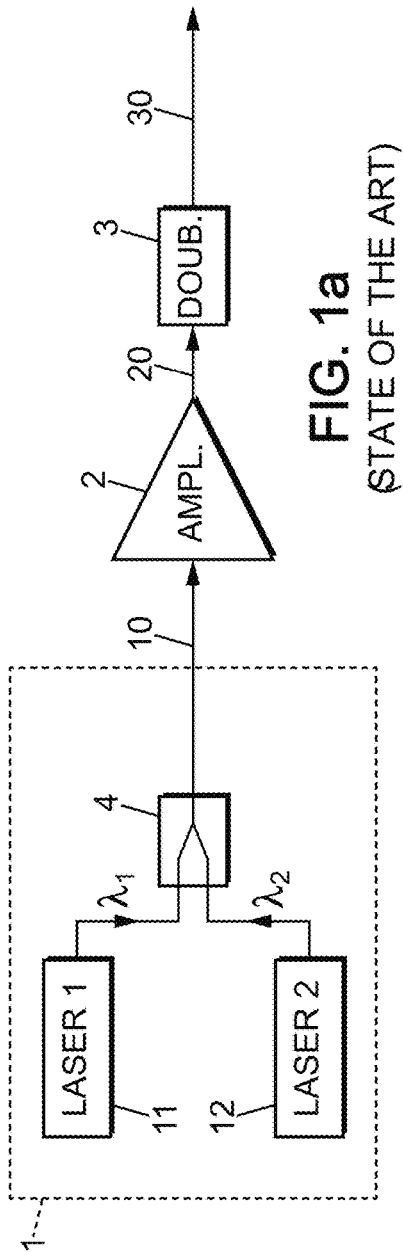
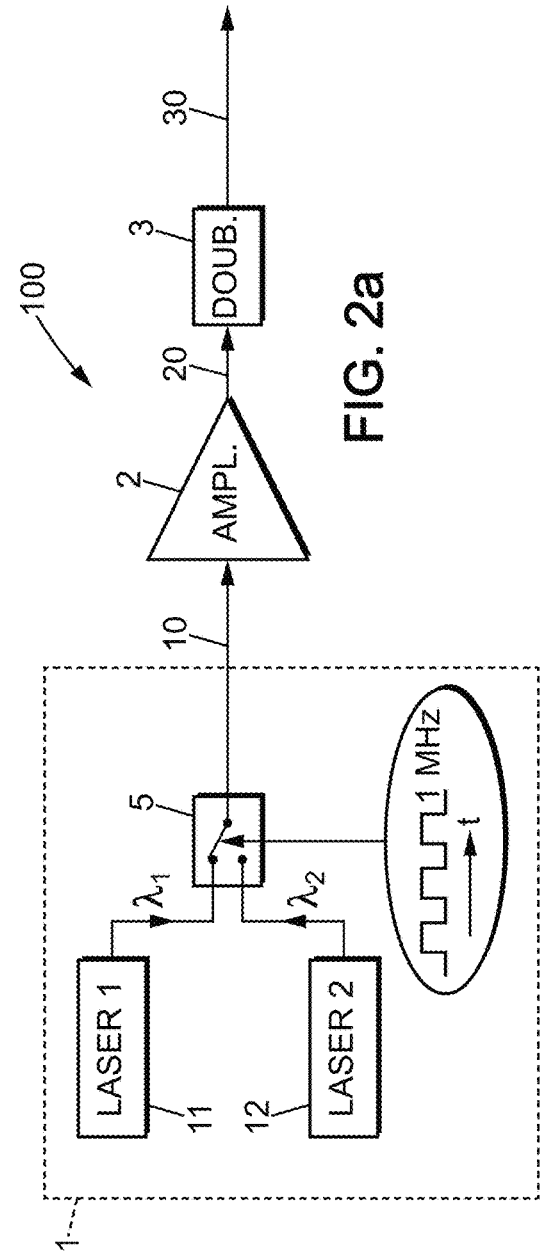

(STATE OF THE ART)

LASER SOURCE, AND APPARATUS AND METHOD FOR SIMULTANEOUSLY INTERACTING WITH A PLURALITY OF ATOMIC SPECIES

The present invention relates to a laser source, a device, and a method for interacting simultaneously with several atomic species.

In the context of this invention, interaction with an atomic species refers to a process whereby at least one electronic transition is induced for the atomic species by absorption or (and) emission of photons, using an electromagnetic radiation sent on atoms from this species. The objective of the interaction may be any: trapping a group of atoms from the atomic species, also named spatial containment, cooling or slowing down atoms from the species, a sequence of matter wave interferometry applied on the atoms, optical pumping of the atoms, measuring a proportion of the population of atoms that is in an identified state, etc.

The electromagnetic radiation used for interacting with an atomic species is adapted to the latter. Notably, the wavelength of the radiation is adapted depending on the electronic transition induced for this species. However, depending on the objective for which the interaction is induced, this radiation wavelength might not correspond exactly to the wavelength $\lambda_{at}$ which is associated with the electronic transition, while remaining close to its value.

Yet, some applications require interacting simultaneously with several atomic species. It is then required to produce several electromagnetic radiations with wavelengths corresponding respectively to the atomic species used, in order to induce the electronic transitions for all the atomic species within common time intervals. FIG. 1a illustrates a laser source such as known prior to the present invention, which allows achieving this aim for two different atomic species, using solutions based on frequency doubling. The digital references indicated in this figure have the following meanings:

- 1: laser radiation generating set,
- 2: optical amplifier, labelled AMPL.,
- 3: optical frequency doubler set, labelled DOUB., and adapted to double the frequency of the radiation received by the set at input, and hence to divide by two its wavelength,
- 4: beam combiner, adapted to superimpose two beams of incident radiations within one and same output beam from the combiner,
- 10: output of the laser radiation generating set 1, optically connected to a single input of the amplifier 2,
- 20: output of the amplifier 2, optically connected to an input of the frequency doubler set 3, and
- 30: output of the laser source, from which the radiations are available for interacting with the atomic species.

The set 1 may itself comprise two distinct laser units 11 and 12 labelled laser 1 and laser 2 respectively. These laser units 11 and 12 each produce a laser radiation with an initial wavelength, $\lambda_1$ or $\lambda_2$, associated with one of the atomic species through the frequency doubler set 3. In other words, the wavelength $\lambda_1$ of the laser unit 11 is close or equal to $2\cdot\lambda_{at1}$, where $\lambda_{at1}$ is the wavelength of electronic transition of a first one of the atomic species, and the wavelength $\lambda_2$ of the laser unit 12 is close or equal to $2\cdot\lambda_{at2}$, where $\lambda_{at2}$ is the wavelength of electronic transition of a second one of the atomic species. The two radiations of laser units 11 and 12 are superimposed into one and same beam by the combiner 4, and this superimposition beam is sent to the input of the amplifier 2. Thus, two laser radiations are delivered continuously at the output 30, having respective wavelengths close or equal to $\lambda_{at1}$ and $\lambda_{at2}$ respectively.

But such laser source has the following disadvantage: the maximum amplifier power $P_{ampl}$, available in the amplifier 2 is split between two radiations having the initial wavelengths $\lambda_1$ and $\lambda_2$. Thus, each of these radiations has a power in the order of $P_{ampl}/2$ at the output 20 of the amplifier 2. Furthermore and in a known manner, the power of each radiation at the output of the frequency doubler set 3 is proportional to the square of the power of the corresponding input radiation. Thus, the respective powers $P(\lambda_1/2)$ and $P(\lambda_2/2)$ of the radiations simultaneously produced by the laser source for interacting with the two atomic species, with the wavelengths $\lambda_1/2$ and $\lambda_2/2$ respectively, are each equal to $\eta\cdot P_{ampl}^2/4$ where $\eta$ is the efficiency factor of the frequency doubler set 3. But this output power may be insufficient for obtaining the desired interactions with each atomic species.

FIG. 1b is a time diagram showing the powers of two radiations produced by the laser source for interacting with the two atomic species, for wavelengths $\lambda_1/2$ and $\lambda_2/2$ respectively, depending on time labelled t. These two interaction radiations are continuous, with respective powers which are constant and restricted to $\eta\cdot P_{ampl}^2/4$.

From this situation, a first object of the invention consists in proposing a new laser source allowing interaction with a greater laser power for each atomic species, without increasing the dimensioning of the optical amplifier, i.e. for a maximum amplifier power $P_{ampl}$ which is identical.

A subsidiary object of the invention is to propose such laser source which may be developed with fewer optical components, be compact, and have a low cost price.

For this purpose, the present invention proposes a laser source intended for a device for interacting simultaneously with at least two atomic species within time intervals which are common to these species, by means of at least two interaction radiations dedicated to the species respectively, and having distinct respective wavelengths. The laser source comprises:

- a laser radiation generating set, arranged for producing initial radiations corresponding one-to-one to the interaction radiations;
- an optical amplifier, arranged for receiving at input the initial radiations and for delivering at output the amplified initial radiations; and
- a frequency doubler set, arranged for receiving at input amplified initial radiations and for producing at output the interaction radiations.

The laser source of the invention is characterized in that the laser radiation generating set comprises means for time-division multiplexing adapted for multiplexing the initial radiations by dividing each time interval into several successive time sub-intervals, and for producing during each time sub-interval the initial radiation corresponding to the interaction radiation dedicated to one of the species upon exclusion of another one of the initial radiations corresponding to the interaction radiation dedicated to another one of the species, and with alternation between the initial radiations for successive time sub-intervals.

Thus, through time-division multiplexing of the initial radiations sent to the input of the optical amplifier, the maximum amplifier power $P_{ampl}$ available at any time during the operation of the laser source, is devoted to a single one of the radiations intended for interacting with the atomic species. When the invention is applied to two atomic species, the instant power of each amplified initial radiation is increased by a factor of two, and subsequently the instant power of each interaction radiation is increased by a factor of four, downstream of the frequency doubler set. The average power of each interaction radiation is thus increased by a factor of two in the case of two atomic species with a single interaction radiation dedicated to each species.

When the invention is applied to three atomic species, the instant power of each amplified initial radiation is increased by a factor of three, and subsequently the instant power of each interaction radiation is increased by a factor of nine, downstream of the frequency doubler set. The average power of each interaction radiation is thus increased by a factor of three in the case of three atomic species with a single interaction radiation dedicated to each species.

For this purpose, time-division multiplexing of the radiations is implemented at a frequency high enough so that the result of the interaction between each atomic species and the radiation intended for it is identical to the result of the interaction with a continuous radiation. The duration of each time sub-interval as well as the duration between two successive time sub-intervals are adapted depending on physical parameters of the electronic transitions implemented for the interactions. Preferably, the means for multiplexing may be adapted so that each time sub-interval has a duration comprised between 0.1 microsecond and 1 millisecond. However, the duration of the time sub-intervals dedicated to different atomic species may differ from one species to another depending on the features of the electronic transitions of all the atomic species used.

Preferably, the fill rate of time-division multiplexing may be higher than 90%. The fill rate of multiplexing is defined as the ratio of the duration in which the laser source delivers an interaction radiation to the amplifier over the period of multiplexing.

In preferred embodiments of the invention, the following improvements may be used separately or in combination:
  the laser radiation generating set may comprise at least one laser diode or semiconductor laser adapted to produce a radiation with a wavelength comprised between 1500 nm and 1600 nm. Such laser unit may be of the type used in telecommunication, and is inexpensive;
  the means for time-division multiplexing may comprise at least one of an optical switch and an acousto-optical modulator;
  the laser radiation generating set may be further adapted to produce simultaneously, during some of the time sub-intervals, two initial radiations corresponding to two interaction radiations dedicated to a same one of the atomic species, respectively. In this case, both radiations dedicated to one same atomic species produce different interactions with this species, such as an optical re-pumping and a stimulated Raman transition, for example;
  the laser radiation generating set may comprise at least one laser unit adapted to generate a base radiation. In this case, the set is arranged so that at least two of the initial radiations are obtained from a modulation of this base radiation; and
  the frequency doubler set may comprise a nonlinear crystal arranged to produce several of the interaction radiations from the corresponding amplified initial radiations respectively, received at input by the nonlinear crystal.

The invention further proposes the device for interacting with the plurality of atomic species within time intervals which are common to these species, when this device comprises:

an atom source set, adapted to deliver atoms belonging to the atomic species;
  a laser source according to the invention such as described previously; and
  means for directing each interaction radiation produced by the frequency doubler set, onto at least part of the atoms from the species to which this interaction radiation is dedicated.

In such device, the effect of the interaction, the containment for example, for each species during a multiplexing period is not modified with respect to that of the interaction with a continuous radiation dedicated to this species.

The interaction radiation which is dedicated to at least one of the atomic species may be adapted to spatially contain atoms from the species, cool them, slow them down, apply a sequence of matter wave interferometry to them, optically pump them, or measure a proportion of the population of this species which is in one atomic state.

At least one of rubidium 85, rubidium 87, potassium 39, and potassium 40 may form one of the atomic species with which the device of the invention interacts.

Finally, the invention also proposes a method for interacting simultaneously with at least two atomic species within time intervals which are common to these species, by means of at least two interaction radiations dedicated to the species respectively, and with distinct respective wavelengths. Such method according to the invention comprises the steps of:
  /1/ dividing each time interval into several successive time sub-intervals;
  /2/ producing during each time sub-interval an initial radiation corresponding to the interaction radiation dedicated to one of the species upon exclusion of another initial radiation corresponding to the interaction radiation which is dedicated to another one of the species, and with alternation between the initial radiations for successive time sub-intervals;
  /3/ amplifying the initial radiations produced during the successive time sub-intervals using one and same optical amplifier for these initial radiations, to obtain amplified initial radiations;
  /4/ doubling the frequency of each amplified initial radiation to obtain the interaction radiations; and
  /5/ directing each interaction radiation at least onto atoms from the species to which this radiation is dedicated,
so that the effect of the radiation for each species during the total time interval is not modified with respect to that of the interaction with a continuous radiation dedicated to said species.

Figure 2B:
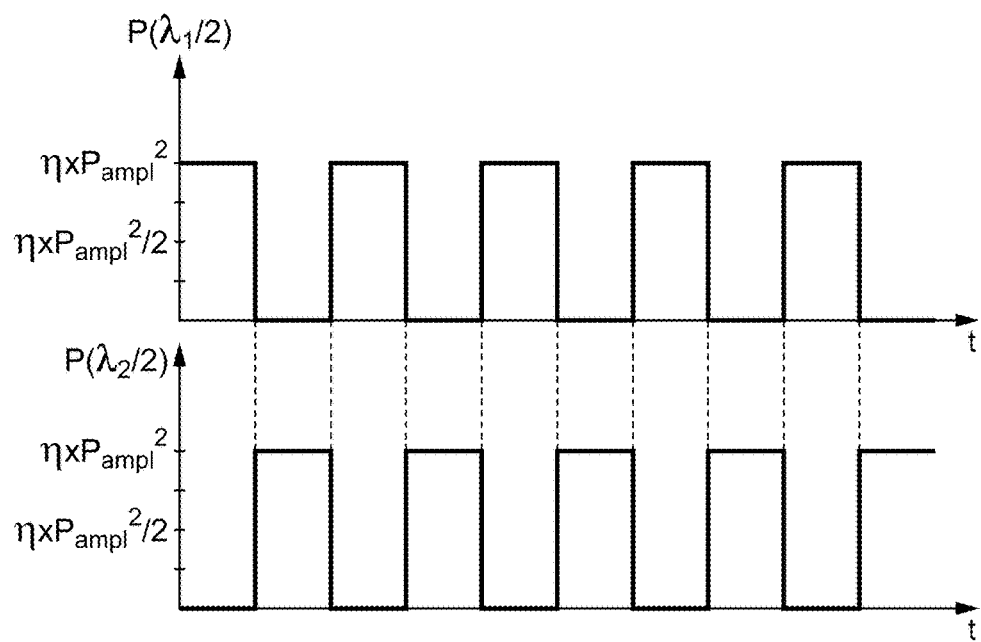
Figure 3:
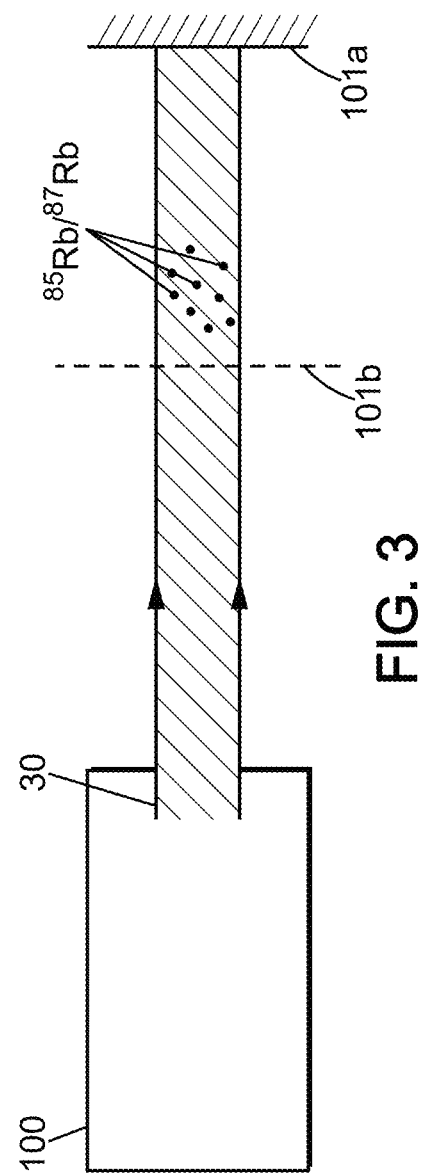

Other features and advantages of the present invention will appear in the following description of implementation examples which are non-limiting, in reference to the accompanying drawings, wherein:

FIG. 1a, already described, is an optical diagram of a laser source existing prior to the present invention;

FIG. 1b, also already described, is a time diagram of the radiation powers produced by a laser source in compliance with FIG. 1a;

FIGS. 2a and 2b correspond to FIGS. 1a and 1b respectively for a laser source in compliance with the present invention;

FIG. 3 represents a device according to the invention; and

Figure 4:
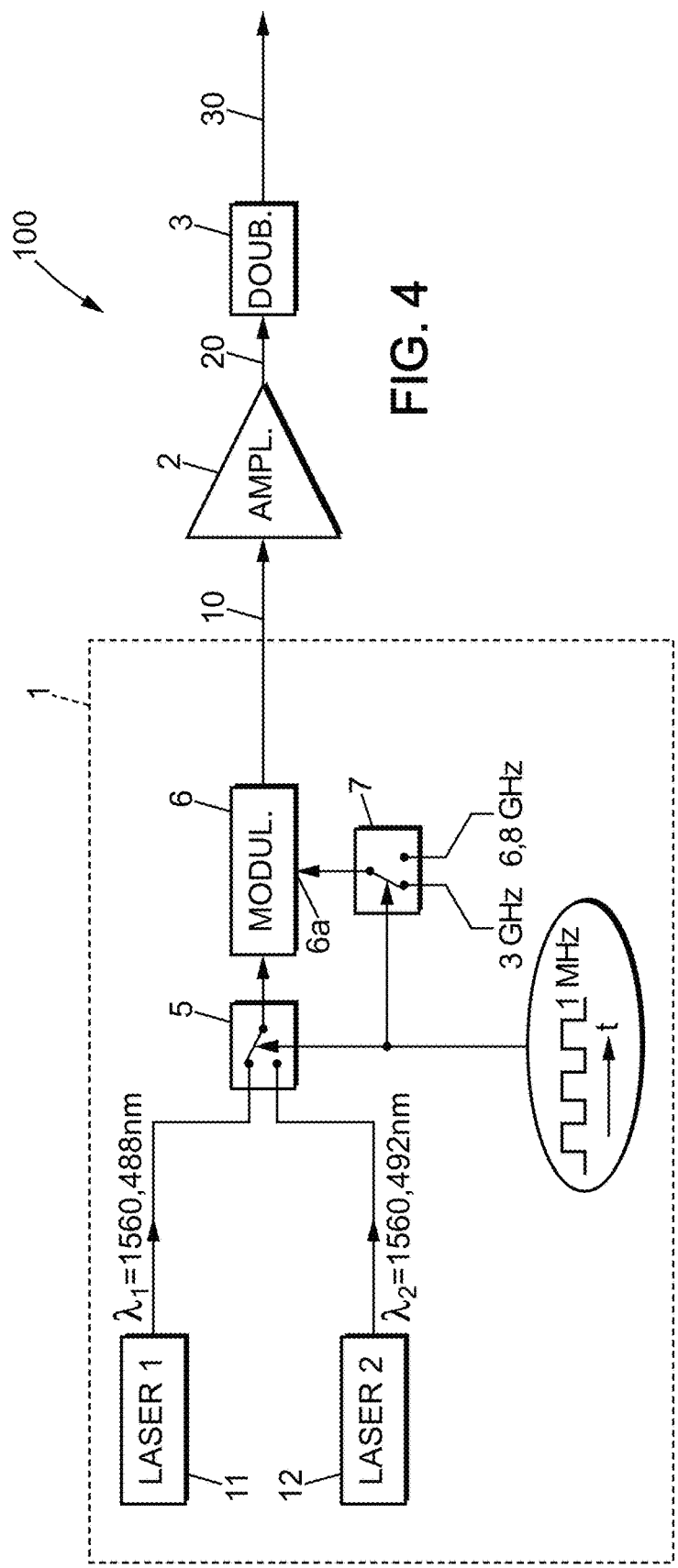
Figure 5:
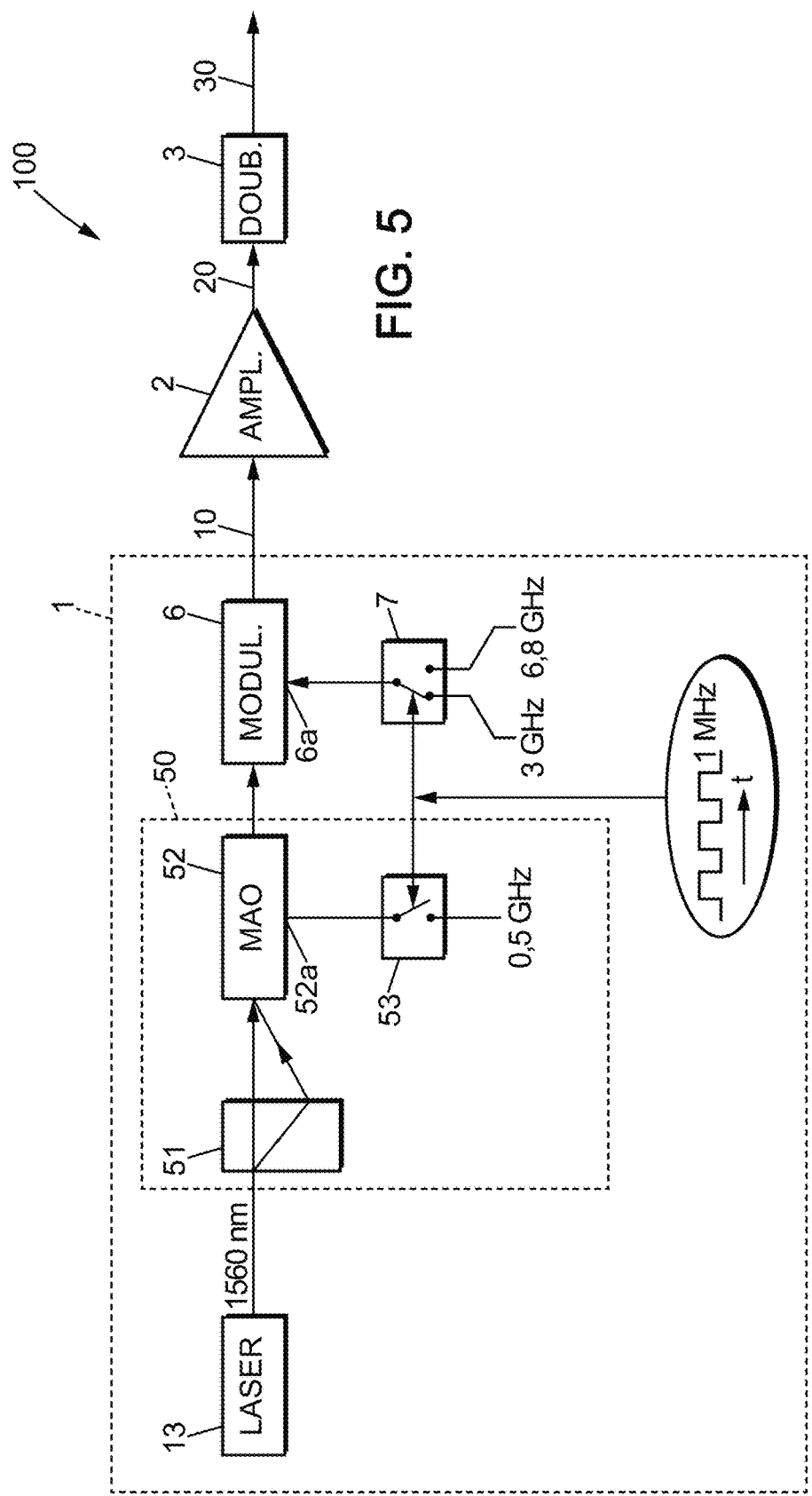

FIGS. 4 and 5 correspond to FIG. 2a for two improvements of the present invention respectively.

Identical references indicated in the different figures denote elements which are identical or have identical functions. Furthermore, for reasons of clarity, the use of optical components which are not represented nor described is considered as based on the general knowledge of the person skilled in the art.

The invention is now described in the particular case of interactions with only two atomic species. From this description, the person skilled in the art will be able to adapt the laser sources intended for two atomic species, in order to obtain laser sources in compliance with the invention and capable of interacting simultaneously with three atomic species or more.

In compliance with FIG. 2a, a laser source according to the invention referenced 100 may be obtained from the structure of FIG. 1a, by replacing the combiner 4 with a switch 5. This switch may be an optical or acousto-optical switch.

The initial radiations with wavelengths $\lambda_1$ and $\lambda_2$ are produced at the output 10 of the laser radiation generating set 1. The amplified initial radiations are produced at the output 20 of the optical amplifier 2, and the interaction radiations are produced at the output 30 of the laser source 100. The frequency doubler set 3 implements a division by two of each wavelength $\lambda_1$ and $\lambda_2$.

The switch 5 may be controlled by a time-varying function in the form of crenels, so that the switch 5 alternately transmits the initial radiation produced by the laser unit 11 or that produced by the laser unit 2, to the optical amplifier 2. The time interval considered may be the operation duration of the laser source 100, and the time sub-intervals dedicated to a first one of the atomic species may be that in which the switch 5 connects the laser unit 11 to the amplifier 2. The time sub-intervals dedicated to the second atomic species are then those in which the switch 5 connects the laser unit 12 to the amplifier 2. Thus, the initial radiations with wavelengths $\lambda_1$ and $\lambda_2$ are alternately transmitted to the amplifier 2.

The instant power of each amplified initial radiation, as existing at the output 20 of the amplifier 2, is thus $P_{ampl}$, but in a manner restricted within the time sub-intervals during which the switch 5 transmits the corresponding initial radiation to the amplifier 2. The frequency of the crenel-like control function of the switch 5 may be, for example, in the order of 1 MHz (megahertz).

Possibly, both lasers units 11 and 12 may be replaced with one single laser unit with variable wavelength. This variable unit is then controlled to produce alternately the initial radiations with wavelengths $\lambda_1$ and $\lambda_2$, according to an alternation frequency which may also be in the order of 1 MHz.

Alternatively, the two laser units 11 and 12 may be replaced with a single laser unit having fixed wavelength, but this wavelength is modulated separately downstream the laser unit, by a micro-wave frequency which is applied in a discontinuous manner.

The instant power of each of the interaction radiations as existing at the output 30 of the laser source 100, with wavelengths $\lambda_1/2$ or $\lambda_2/2$ respectively, is hence equal to $\eta \cdot P_{ampl}^2$. Consequently, the power averaged with respect to time t for each of the interaction radiations is equal to $\eta \cdot P_{ampl}^2/2$, instead of $\eta \cdot P_{ampl}^2/4$ for the laser source in FIG. 1a.

FIG. 3 represents a device in compliance with the invention, wherein interactions with the two rubidium isotopes 85 and 87 ($^{85}$Rb, $^{87}$Rb) are induced simultaneously. The interaction radiation beam produced at the output 30 of the laser source 100, is directed onto the atoms of rubidium 85 and rubidium 87 using optical components such as a mirror 101a, or a semi-reflecting or quarter-wave plate 101b. Possible arrangements of these components in order to direct the interaction radiations onto the atoms are known by the person skilled in the art. In the particular case of rubidium atoms, the two laser units 11 and 12 may each be of telecommunication laser type, with initial wavelengths $\lambda_1$ and $\lambda_2$ respectively, each of about 1569 nm (nanometer). The difference in wavelength between the interaction radiation dedicated to the rubidium isotope 85 and that dedicated to the isotope 87, i.e. $\lambda_1/2 - \lambda_2/2$, is about 0.002 nm, corresponding to a micro-wave frequency of 1 GHz (gigahertz). For this purpose, the difference between the initial wavelengths $\lambda_1$ and $\lambda_1$ of laser units 11 and 12 may be about 0.004 nm, corresponding to a micro-wave frequency of about 0.5 GHz.

The laser source of FIG. 4 consists in an improvement of that of FIG. 2a. According to this first improvement, the source 100 provides simultaneously an optical re-pumping radiation and a radiation for stimulating Raman transitions for rubidium 85 atoms during the time sub-intervals dedicated to this isotope 85, and the same applies for rubidium 87 atoms during the other time sub-intervals dedicated to the isotope 87.

For this purpose, the laser unit 11 may be dedicated to the isotope $^{85}$Rb by being adapted to produce a first initial laser radiation with a wavelength $\lambda_1$ equal to 1560.488 nm. This first initial radiation is then modulated according to a micro-wave frequency of 3 GHz to simultaneously obtain the re-pumping radiation and the Raman transition stimulation radiation for $^{85}$Rb.

At the same time, the laser unit 12 may be dedicated to the isotope $^{87}$Rb by being adapted to produce a second initial laser radiation with a wavelength $\lambda_2$ equal to 1560.492 nm. This second initial radiation is then modulated according to a micro-wave frequency of 6.8 GHz for obtaining simultaneously the re-pumping radiation and the Raman transition stimulation radiation for $^{87}$Rb.

For this purpose, the laser source of FIG. 4 may be obtained by inserting a phase modulator between the output of the switch 5 and the output 10 of the laser radiation generating set 1. This phase modulator is labelled MODUL. and referenced 6. Its modulation control entry 6a is supplied alternately with a micro-wave frequency signal of 3 GHz, or with a micro-wave frequency signal of 6.8 GHz, through an electric switch 7. The switch 5 and the electric switch 7 are then controlled in a synchronous manner by the crenel-like signal at about 1 MHz. Furthermore, the switches 5 and 7 are each connected at input so that the switch 5 receives the initial radiation of the unit 11 during the same time sub-intervals as those for which the switch 7 receives the input 3 GHz micro-wave signal.

FIG. 5 illustrates an additional improvement, according to which the source 100 is developed from a single laser unit 13, which has a wavelength that is fixed and again close to 1560 nm. For this purpose, from the laser source structure of FIG. 4, the switch 5 is replaced by a switching set 50 which comprises a beam divider 51, an acousto-optical modulator (MAO) 52, and an additional electrical switch 53. The beam divider 51 is supplied at input by the laser unit 13, and produces at output two beams which are inputted into the acousto-optical modulator 52 with incidences corresponding to diffraction orders zero and one for a modulation frequency of 0.5 GHz. The control input 52a of the acousto-optical modulator 52 is itself supplied with a signal having micro-wave frequency equal to about 0.5 GHz, synchronously while supplying the phase modulator 6 with 3 GHz micro-wave signal. The radiation produced at the output 10 of the set 1 of FIG. 5 is then similar at any time to that of the set 1 of FIG. 4.

It is implied that the present invention may be reproduced by adapting some implementation details which have been described above, while preserving at least some of the advantages that have been listed. Among these adaptations, the following are enumerated in a non-limiting way:

the source and the device may be adapted to interact with potassium atoms instead of or in addition to the rubidium atoms. The atomic species used or some of them may be the potassium isotope 39 ($^{39}$K) and/or the potassium isotope 40 ($^{40}$K). In such case, the wavelengths of the initial radiations are about 1534 nm for these two potassium isotopes, instead of about 1560 nm for the rubidium isotopes, and the micro-wave frequencies are 0.2 GHz for the $^{39}$K isotope instead of 6.8 GHz for $^{85}$Rb, and 0.6 GHz for $^{40}$K instead of 3 GHz for $^{87}$Rb;

the source and the device may be designed for interacting simultaneously with more than two atomic species, including at least one rubidium isotope and at least one potassium isotope. In such case, it is preferable to use separate frequency doublers for the rubidium atoms and the potassium ones, because of the wavelength difference between the interaction radiations which are dedicated to the rubidium atoms and the potassium atoms, respectively;

different atomic species used in a device according to the invention may be located at one same location or not in this device during their interactions with the corresponding radiations; and the acousto-optical modulator 5 in FIG. 4 and the switching set 50 in FIG. 5 may be combined in parallel within one and same laser source according to the invention, in separate optical paths alternately supplying the optical amplifier 2, and dedicated to different atomic species respectively. For example, a first supply path may be dedicated to rubidium, comprising at least a first laser unit at 1560 nm and the acousto-optical modulator 5, and a second path may be dedicated to potassium, comprising at least a second laser unit at 1534 nm and the switching set 50.

The invention claimed is:

1. A laser source (100) intended for a device for interacting simultaneously with at least two atomic species within time intervals which are common to said species, by means of at least two interaction radiations dedicated to said species respectively, and having distinct respective wavelengths, the laser source comprising:
    a laser radiation generating set (1), arranged for producing initial radiations corresponding one-to-one to the interaction radiations;
    an optical amplifier (2), arranged for receiving at input the initial radiations and for delivering at output amplified initial radiations; and
    a frequency doubler set (3), arranged for receiving at input the amplified initial radiations and for producing at output the interaction radiations,
    wherein the laser radiation generating set (1) comprises means for time-division multiplexing adapted for multiplexing the initial radiations by dividing each time interval into several successive time sub-intervals, and for producing during each time sub-interval the initial radiation corresponding to the interaction radiation dedicated to one of the species upon exclusion of another one of the initial radiations corresponding to the interaction radiation dedicated to another one of the species, and with alternation between the initial radiations for successive time sub-intervals.

2. The laser source according to claim 1, wherein the means for time-division multiplexing are adapted so that each time sub-interval has a duration comprised between 0.1 microsecond and 1 millisecond.

3. The laser source according to claim 1, wherein the laser radiation generating set (1) comprises at least one laser diode or semiconductor laser adapted to produce a radiation with a wavelength comprised between 1500 nm and 1600 nm.

4. The laser source according to claim 1, wherein the means for time-division multiplexing comprise at least one of a switch (5) or an acousto-optical modulator (52).

5. The laser source according to claim 1, wherein the laser radiation generating set (1) is further adapted to produce simultaneously, during some of the time sub-intervals, two initial radiations corresponding to two interaction radiations which are dedicated to a same one of the species, respectively.

6. The laser source according to claim 1, wherein the laser radiation generating set (1) comprises at least one laser unit (13) adapted to generate at base radiation, and said laser radiation generating set is arranged so that at least two of the initial radiations are obtained from a modulation of said base radiation.

7. A device for interacting simultaneously with at least two atomic species within time intervals which are common to said species, comprising:
    an atom source set, adapted to deliver atoms belonging to said at least two atomic species;
    a laser source (100) according to claim 1; and
    means (101a, 101b) for directing each interaction radiation produced by the frequency doubler set (3), onto at least part of the atoms from the species to which said interaction radiation is dedicated;
    so that the effect of the interaction for each species during a multiplexing period is not modified with respect to that of the interaction with a continuous radiation dedicated to said species.

8. The device according to claim 7, wherein at least one of the interaction radiations is adapted to spatially contain atoms from the species to which said interaction radiation is dedicated, cooling said atoms, slowing said atoms down, applying a sequence of matter wave interferometry to said atoms, optically pumping said atoms, or measuring a proportion of a population of said species which is in one atomic state.

9. The device according to claim 7, wherein at least one of the atomic species is selected from rubidium 85, rubidium 87, potassium 39, and potassium 40.

10. A method for interacting simultaneously with at least two atomic species within time intervals which are common to said species, by means of at least two interaction radiations dedicated to said species respectively, and having distinct respective wavelengths, the method comprising the steps of:
    /1/ dividing each time interval into several successive time sub-intervals;
    /2/ producing during each time sub-interval an initial radiation corresponding to the interaction radiation dedicated to one of the species upon exclusion of another initial radiation corresponding to the interaction radiation dedicated to another one of said species, and with alternation between the initial radiations for successive time sub-intervals;

/3/ amplifying the initial radiations produced during the successive time sub-intervals using one and same optical amplifier (2) for said initial radiations, to obtain amplified initial radiations;

/4/ doubling the frequency of each amplified initial radiation to obtain the interaction radiations; and /5/ directing each interaction radiation at least onto atoms from the species to which said interaction radiation is dedicated, so that the effect of the interaction for each species after the total time interval is not modified with respect to that of the interaction with a continuous radiation dedicated to said species.

11. The laser source according to claim 2, wherein the laser radiation generating set (1) comprises at least one laser diode or semiconductor laser adapted to produce a radiation with a wavelength comprised between 1500 nm and 1600 nm.

12. The laser source according to claim 2, wherein the means for time-division multiplexing comprise at least one of a switch (5) or an acousto-optical modulator (52).

13. The laser source according to claim 3, wherein the means for time-division multiplexing comprise at least one of a switch (5) or an acousto-optical modulator (52).

14. The laser source according to claim 2, wherein the laser radiation generating set (1) is further adapted to produce simultaneously, during some of the time sub-intervals, two initial radiations corresponding to two interaction radiations which are dedicated to a same one of the species, respectively.

15. The laser source according to claim 3, wherein the laser radiation generating set (1) is further adapted to produce simultaneously, during some of the time sub-intervals, two initial radiations corresponding to two interaction radiations which are dedicated to a same one of the species, respectively.

16. The laser source according to claim 4, wherein the laser radiation generating set (1) is further adapted to produce simultaneously, during some of the time sub-intervals, two initial radiations corresponding to two interaction radiations which are dedicated to a same one of the species, respectively.

17. The laser source according to claim 2, wherein the laser radiation generating set (1) comprises at least one laser unit (13) adapted to generate at base radiation, and said laser radiation generating set is arranged so that at least two of the initial radiations are obtained from a modulation of said base radiation.

18. The laser source according to claim 3, wherein the laser radiation generating set (1) comprises at least one laser unit (13) adapted to generate at base radiation, and said laser radiation generating set is arranged so that at least two of the initial radiations are obtained from a modulation of said base radiation.

19. The laser source according to claim 4, wherein the laser radiation generating set (1) comprises at least one laser unit (13) adapted to generate at base radiation, and said laser radiation generating set is arranged so that at least two of the initial radiations are obtained from a modulation of said base radiation.

20. The laser source according to claim 5, wherein the laser radiation generating set (1) comprises at least one laser unit (13) adapted to generate at base radiation, and said laser radiation generating set is arranged so that at least two of the initial radiations are obtained from a modulation of said base radiation.

* * * * *